(12) United States Patent
Tanaka

(10) Patent No.: US 7,138,673 B2
(45) Date of Patent: Nov. 21, 2006

(54) SEMICONDUCTOR PACKAGE HAVING ENCAPSULATED CHIP ATTACHED TO A MOUNTING PLATE

(75) Inventor: Takekazu Tanaka, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 9 days.

(21) Appl. No.: 10/602,044

(22) Filed: Jun. 24, 2003

(65) Prior Publication Data

US 2004/0082109 A1    Apr. 29, 2004

(30) Foreign Application Priority Data

Aug. 19, 2002   (JP)   ............... 2002-237731

(51) Int. Cl.
   *H01L 29/76*   (2006.01)
   *H01R 9/00*   (2006.01)
(52) U.S. Cl. ............... 257/288; 257/341; 257/672; 361/772; 361/813
(58) Field of Classification Search ............... 257/288, 257/672, 676, 690, 693, 724, 776, 784, 787; 438/123, 124, 127; 361/772, 773, 813
See application file for complete search history.

(56) References Cited

U.S. PATENT DOCUMENTS

| | | | | |
|---|---|---|---|---|
| 5,172,214 A | * | 12/1992 | Casto | ............... 257/676 |
| 5,592,019 A | * | 1/1997 | Ueda et al. | ............... 257/666 |
| 5,767,569 A | * | 6/1998 | Ohta et al. | ............... 257/668 |
| 6,043,430 A | * | 3/2000 | Chun | ............... 174/52.4 |
| 6,242,798 B1 | * | 6/2001 | Cha et al. | ............... 257/673 |
| 6,297,544 B1 | * | 10/2001 | Nakamura et al. | ............... 257/666 |
| 6,307,272 B1 | * | 10/2001 | Takahashi et al. | ............... 257/787 |
| 2002/0070431 A1 | * | 6/2002 | Misumi et al. | ............... 257/666 |
| 2003/0075785 A1 | * | 4/2003 | Crowley et al. | ............... 257/676 |
| 2005/0121799 A1 | * | 6/2005 | Uchida | ............... 257/773 |

FOREIGN PATENT DOCUMENTS

| | | |
|---|---|---|
| JP | 52-127756 | 10/1977 |
| JP | 2714037 | 3/1990 |
| JP | 05-121615 | 5/1993 |
| JP | 08-255863 | 10/1996 |
| JP | 10-214933 | 8/1998 |
| JP | 11-166106 | 6/1999 |
| JP | 11-354702 | 12/1999 |
| JP | 2000049184 A | * 2/2000 |
| JP | 2000-114445 | 4/2000 |
| JP | 3240292 | 4/2000 |

* cited by examiner

*Primary Examiner*—Alonzo Chambliss
(74) *Attorney, Agent, or Firm*—Young & Thompson

(57) ABSTRACT

In a semiconductor package including at least one plate-like mount, a semiconductor chip has at least one electrode formed on a top surface thereof, and is mounted on the plate-like mount such that a bottom surface of the semiconductor chip is in contact with the plate-like mount. The semiconductor package also includes at least one lead element having an outer portion arranged to be flush with the plate-like mount, and an inner portion deformed and shaped to overhang the semiconductor chip such that an inner end of the lead element is spaced apart from the top surface of the semiconductor chip. The semiconductor package further includes a bonding-wire element bonded at ends thereof to the electrode of the semiconductor chip and the inner end of the lead element, an enveloper sealing and encapsulating the plate-like mount, the semiconductor chip, the inner portion of the lead element, and the bonding-wire element.

17 Claims, 18 Drawing Sheets

SEMICONDUCTOR PACKAGE HAVING ENCAPSULATED CHIP ATTACHED TO A MOUNTING PLATE

BACKGROUND OF THE INVENTION

1. Field of the Invention

The present invention relates to a semiconductor package including a plate-like mount, a semiconductor chip mounted on the plate-like mount, a plurality of leads electrically connected to the semiconductor chip, and an enveloper sealing and encapsulating the plate-like mount, semiconductor chip, and inner portions of the leads.

Also, the present invention relates to a production process for manufacturing such a semiconductor package.

2. Description of the Related Art

For example, as disclosed in Japanese Patent Publication No. 2714037 corresponding to Japanese Laid-Open Patent Publication (KOKAI) No. HEI-01-087535, a lead frame is used to manufacture an electronic package having a plurality of leads.

In particular, the lead frame includes an outer frame section, a plurality of islands or plate-like mounts, and a set of lead sections associated with each plate-like mount, and the plate-like mounts and lead sections are suitably supported by the outer frame section. A semiconductor chip is mounted on each plate-like mount, and is electrically connected to inner end portions of the lead sections in each set through the intermediary of bonding-wires.

Then, each plate-like mount, the semiconductor chip mounted thereon, and the inner end portions of the lead sections are sealed and encapsulated in a mold resin or enveloper, resulting in production of a plurality of electronic packages on the lead frame. Thereafter, the individual electric packages are cut and separated from the lead frame, using a punching machine.

In this type electronic package, especially a MOSFET package, there is a demand for miniaturization of the electronic package, whereas there is a demand for use of a large-sized semiconductor chip in the electronic package to thereby obtain a high power performance. To deal with these contradictory demands, it is proposed that the inner ends of the lead sections are directly and electrically connected to the semiconductor chip, as disclosed in Japanese Laid-Open Patent Publication (KOKAI) No. HEI-11-354702, and Japanese Patent Publication No. 3240292 corresponding to Japanese Laid-Open Patent Publication (KOKAI) No. 2000-114445.

Namely, it is possible to compactly arrange the lead sections with respect to the semiconductor chip mounted on the plate-like mount, due to the direct connection between the semiconductor chip and the inner ends of the lead sections. However, this arrangement of the lead sections fails to obtain a sufficiently high power performance in the electronic package, as discussed in detail hereinafter.

In short, conventionally, there are no proposals for successively dealing with the aforesaid contradictory demands.

SUMMARY OF THE INVENTION

Therefore, an object of the present invention is to provide a semiconductor package, including a plate-like mount, a semiconductor chip mounted on the mount, a plurality of leads electrically connected to the semiconductor chip, and an enveloper encapsulating the mount, semiconductor chip, and inner portions of the leads, wherein it is possible to use a large-sized semiconductor chip without increasing an entire size of the semiconductor package.

Another object of the present invention is to provide a production process for manufacturing the above-mentioned semiconductor package.

In accordance with a first aspect of the present invention, there is provided: a semiconductor package comprising: at least one plate-like mount; a semiconductor chip having at least one electrode formed on a top surface thereof, and mounted on the plate-like mount such that a bottom surface of the semiconductor chip is in contact with the plate-like mount; at least one lead element having an outer portion arranged to be flush with the plate-like mount, and an inner portion deformed and shaped to overhang the semiconductor chip such that an inner end of the lead element is spaced apart from the top surface of the semiconductor chip; a bonding-wire element bonded at ends thereof to the electrode of the semiconductor chip and the inner end of the lead element; and an enveloper sealing and encapsulating the plate-like mount, the semiconductor chip, the inner portion of the lead element, and the bonding-wire element.

In this semiconductor package, when the electrode is defined as a first electrode, and when the lead element is defined as a first lead element, the semiconductor chip may have a second electrode formed on the top surface thereof, and the semiconductor package may comprise a second lead element having an outer portion arranged to be flush with the plate-like mount, and an inner portion deformed and shaped to overhang the semiconductor chip such that an inner end of the second lead element is directly and electrically connected to the second electrode of the semiconductor chip.

On the other hand, the semiconductor package may further comprise a second lead element having an outer portion arranged to be flush with the plate-like mount, and an inner portion deformed and shaped to overhang the semiconductor chip such that an inner end of the second lead element is spaced apart from the top surface of the semiconductor chip, and at least one bonding-wire element bonded at ends thereof to the electrode of the semiconductor chip and the inner end of the second lead element.

The semiconductor may be constructed as a MOSFET chip having a drain electrode formed on a bottom surface thereof and electrically connected to the plate-like mount. In this case, the respective first and second electrodes are defined as a source electrode and a gate electrode, and the plate-like mount has at least one lead element extending therefrom.

The MOSFET chip may be formed as a high power type. In this case, the source electrode should have a larger area than that of the gate electrode. Preferably, the sealing and capsulation of the plate-like mount in the enveloper is carried out such that a bottom surface of the plate-like mount is exposed to outside.

Further, the semiconductor chip may be constructed as a diode chip. In this case, one of the first and second electrodes formed on the top surface of the semiconductor chip is defined as an anode electrode, the other electrode is defined as a cathode electrode.

In the semiconductor package according to the present invention, the semiconductor chip may have another electrode formed on a bottom surface thereof and electrically connected to the plate-like mount, and the plate-like mount has at least one lead element extending therefrom. In this case, the semiconductor chip may be constructed as a diode chip, with one of the electrodes formed on the top and bottom surfaces of the semiconductor chip being defined as an anode electrode, with the remaining electrode being defined as a cathode electrode.

The diode chip may formed as a high power type. In this case, the sealing and capsulation of the plate-like mount in the enveloper is carried out such that a bottom surface of the plate-like mount is exposed to outside.

In accordance with a second aspect of the present invention, there is a production process for manufacturing a semiconductor package, which comprises: preparing a first lead frame having at least one plate-like mount; mounting a semiconductor chip on the plate-like mount, the semiconductor chip having at least one electrode formed on a top surface thereof; preparing a second lead frame having at least one lead element, with the lead element having an outer portion, and an inner portion which is previously deformed and shaped with respect to the outer portion; combining and registering the second lead frame with the first lead frame such that the outer portion of the lead element is flush with the plate-like mount of the first lead frame, the deformation and shaping of the inner portion of the lead element being performed such that the inner portion thereof overhangs the semiconductor chip, and such that an inner end of the lead element is spaced apart from the top surface of the semiconductor chip; bonding the electrode of the semiconductor chip and the inner end of the lead element with a bonding-wire element at ends thereof to establish an electrical connection therebetween; and sealing and encapsulating the plate-like mount, the semiconductor chip, the inner portion of the lead element, and the bonding-wire element in an enveloper.

In this production process, when the electrode is defined as a first electrode, and when the lead element is defined as a first lead element, the semiconductor chip may further have a second electrode formed on the top surface thereof, and the second lead frame may have a second lead element having an outer portion, and an inner portion which is previously deformed and shaped with the outer portion of the second lead element. In this case, the outer portion of the lead element is flush with the plate-like mount of the first lead frame when combining and registering the second lead frame with the first lead frame, and the deformation and shaping of the inner portion of the second lead element is performed such that the inner portion thereof overhangs the semiconductor chip, and such that an inner end of the second lead element is in contact with the second electrode of the semiconductor chip.

Thus, the production process further comprises directly and electrically connecting an inner end of the second lead element to the second electrode of the semiconductor chip. The electrical connection of the inner end of the second lead element to the second electrode of the semiconductor chip may be performed by applying an electrically conductive adhesive to the second electrode of the semiconductor chip before the combination and registering of the second lead frame with the first lead frame. When the electrically conductive adhesive is composed of a thermal fusible paste, the electrical connection of the inner end of the second lead element to the second electrode of the semiconductor chip is achieved by further heating the combined first and second lead frames after the combination and registering of the second lead frame with the first lead frame.

In the production process, the deformation and shaping of the inner portion of the second lead element may be performed such that the inner portion thereof overhangs the semiconductor chip, and such that an inner end of the second lead element is spaced from the top surface of the semiconductor chip. In this case, the production process further comprises bonding the second electrode of the semiconductor chip and the inner end of the second lead element with at least one bonding-wire element at ends thereof to establish an electrical connection therebetween.

BRIEF DESCRIPTION OF THE DRAWINGS

The above objects and other objects will be more clearly understood from the description set forth below, with reference to the accompanying drawings, wherein.

DESCRIPTION OF THE PREFERRED EMBODIMENTS

Before descriptions of embodiments of the present invention, for better understanding of the present invention, conventional semiconductor packages will be explained with reference to FIGS. 1, 2, and 3.

Figure 1:
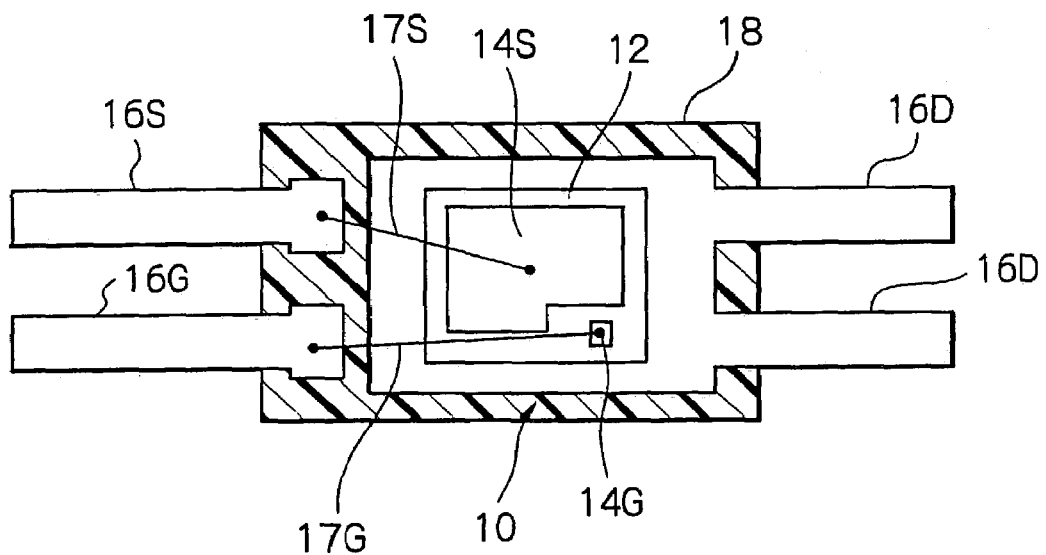
FIG. 1 is a partially-cutaway plan view showing a conventional semiconductor package by way of example.

First, with reference to FIG. 1, a power MOSFET package is representatively illustrated as a first example of the conventional semiconductor package in a partially-cutaway view.

This semiconductor package includes an island or plate-like mount 10, and a semiconductor chip 12 mounted on the plate-like mount 10. In this example, the semiconductor chip 12 is formed as a power MOSFET. Namely, the semiconductor chip 12 has a drain electrode formed on its bottom surface, and a source electrode and a gate electrode formed on its top surface. In FIG. 1, although the drain electrode is invisible, the respective source and gate electrodes are indicated by references 14S and 14G.

As shown in FIG. 1, the plate like mount 10 has a pair of leads 16D integrally extended therefrom, and these leads 16D function as drain-electrode terminals. Also, the semiconductor package includes a set of leads 16S and 16G which are electrically connected at their inner ends to the respective source and gate electrodes 14S and 14G, and the respective leads 14S and 14G function as source-electrode and gate-electrode terminals.

Further, the semiconductor package includes a molded resin or enveloper 18, by which the plate like mount 10, the semiconductor chip 12, the inner ends of the leads 16D, 16S, and 16G, and the bonding-wires 17S and 17G are encapsulated and sealed.

As illustrated in FIG. 1, the source electrode 14S features a considerably larger area than that of the gate electrode 14G such that a high power performance can be achieved in the semiconductor package. For example, this type semiconductor package is representatively disclosed in the aforesaid Publication No. 2714037.

Figure 2:
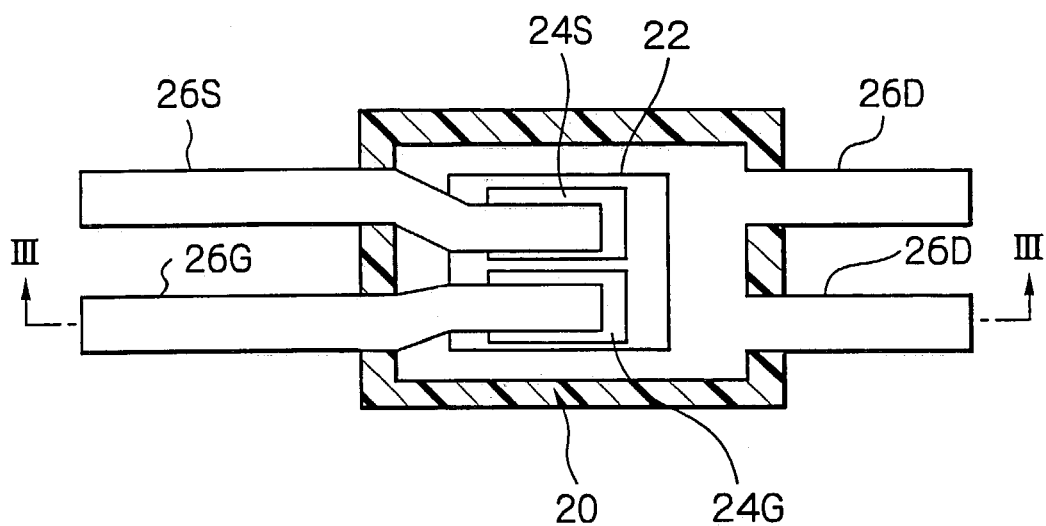
FIG. 2 is a partially-cutaway plan view showing another conventional semiconductor package by way of example.
Figure 3:
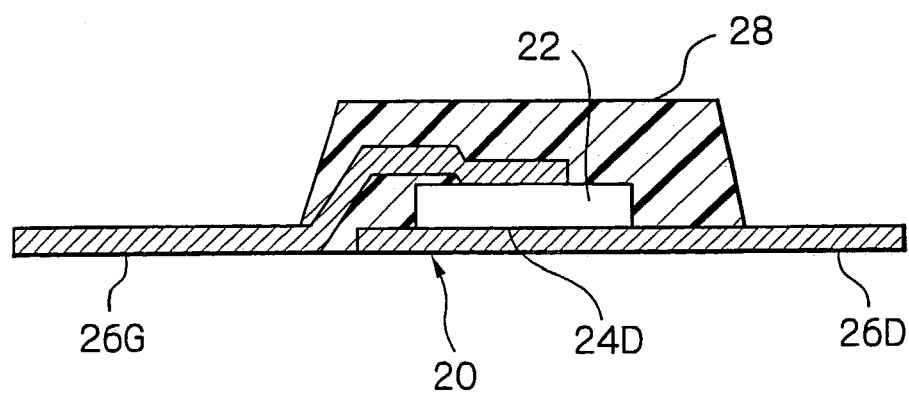
FIG. 3 is a cross-sectional view, taken along the III—III line of FIG. 2.

With reference to FIGS. 2 and 3, a power MOSFET package is representatively illustrated as a second example of the conventional semiconductor package.

Similar to the above-mentioned first example, the semiconductor package includes an island or plate-like mount 20, and a semiconductor chip 22 mounted on the plate-like mount 20. In this second example, the semiconductor chip 22 also includes a power MOSFET. Namely, the semiconductor chip 22 has a drain electrode 24D formed on its bottom surface, and a source electrode 24S and a gate electrode 24G formed on its top surface. As is apparent from FIG. 2, the source electrode 24S features substantially the same area as that of the gate electrode 24G, and these electrodes 24S and 24G are arranged side by side.

As shown in FIGS. 2 and 3, the plate-like mount 20 has a pair of leads 26D integrally extended therefrom, and these leads 26D function as drain-electrode terminals. Also, the semiconductor package includes a set of leads 24S and 24G which are directly and electrically connected at their inner ends to the source and gate electrodes 24S and 24G, and the respective leads 26S and 26G function as source electrode and gate-electrode terminals.

In particular, as is apparent from FIGS. 2 and 3, the lead 26G has an outer portion arranged to be flush with the plate-like mount 20, and an inner portion deformed and shaped to overhang the semiconductor chip 22 so that the inner end of the lead 26G can be directly and electrically connected to the gate electrode 24G. Similarly, the lead 26S has an outer portion arranged to be flush with the plate-like mount 20, and an inner portion deformed and shaped to overhang the semiconductor chip 22 so that the inner end of the lead 26S are directly bounded to the source electrode 24G. For example, the bonding of the respective inner ends of the leads 26S and 26G to the source and gate electrodes 24S and 24G is carried out, using a suitable electric adhesive material, such as silver paste, solder paste or the like, whereby an electrical connection can be established between the source and gate electrodes 24S and 24G and the leads 26S and 26G.

Further, the semiconductor package further includes a molded resin or enveloper 28, by which the plate-like mount 20, the semiconductor chip 22, and the inner portions of the leads 26D, 26S, and 26G are encapsulated and sealed.

For example, this type semiconductor package is representatively disclosed in the aforesaid Publications No. HEI-11-354702, and No. 3240292.

As apparent from the comparison of the second example shown in FIGS. 1 and 2 with the first example shown in FIG. 1, it is possible to make the size of the enveloper 28, and therefore the semiconductor package, smaller than the size of the enveloper 18 shown in FIG. 1 when the sizes of the semiconductor chips 12 and 22 are equal to each other, because the inner portions of the leads 26S and 26G overhang the semiconductor chip 22. In other words, in the second example of FIGS. 2 and 3, it possible to make the size of the semiconductor chip 22 larger than that of the semiconductor chip 12 when the sizes of the envelopers 18 and 28 are equal to each other.

Nevertheless, the high power performance of the second example shown in FIGS. 2 and 3 is inferior to that of the first example shown in FIG. 1, because the area of the source electrode 24S is considerably smaller than that of the source electrode 14S. Namely, with the arrangement of the semiconductor package shown in FIGS. 2 and 3, the area of the source electrode 24S is restricted to the existence of the gate electrode 24G having the same size as the source electrode 24S.

Note, of course, the size of the enveloper (18, 28) may be regarded as a size of the semiconductor package per se.

According to the present invention, it is possible to use a large-sized semiconductor chip in a semiconductor package having a plurality of leads as electrode terminals, without increasing a size of the semiconductor package, as stated below.

With reference to FIGS. 4, 5, 6 and 7, a first embodiment of a semiconductor package according to the present invention is illustrated. In this first embodiment, the semiconductor package is constructed as a dual-in-line type electronic package.

Figure 4:
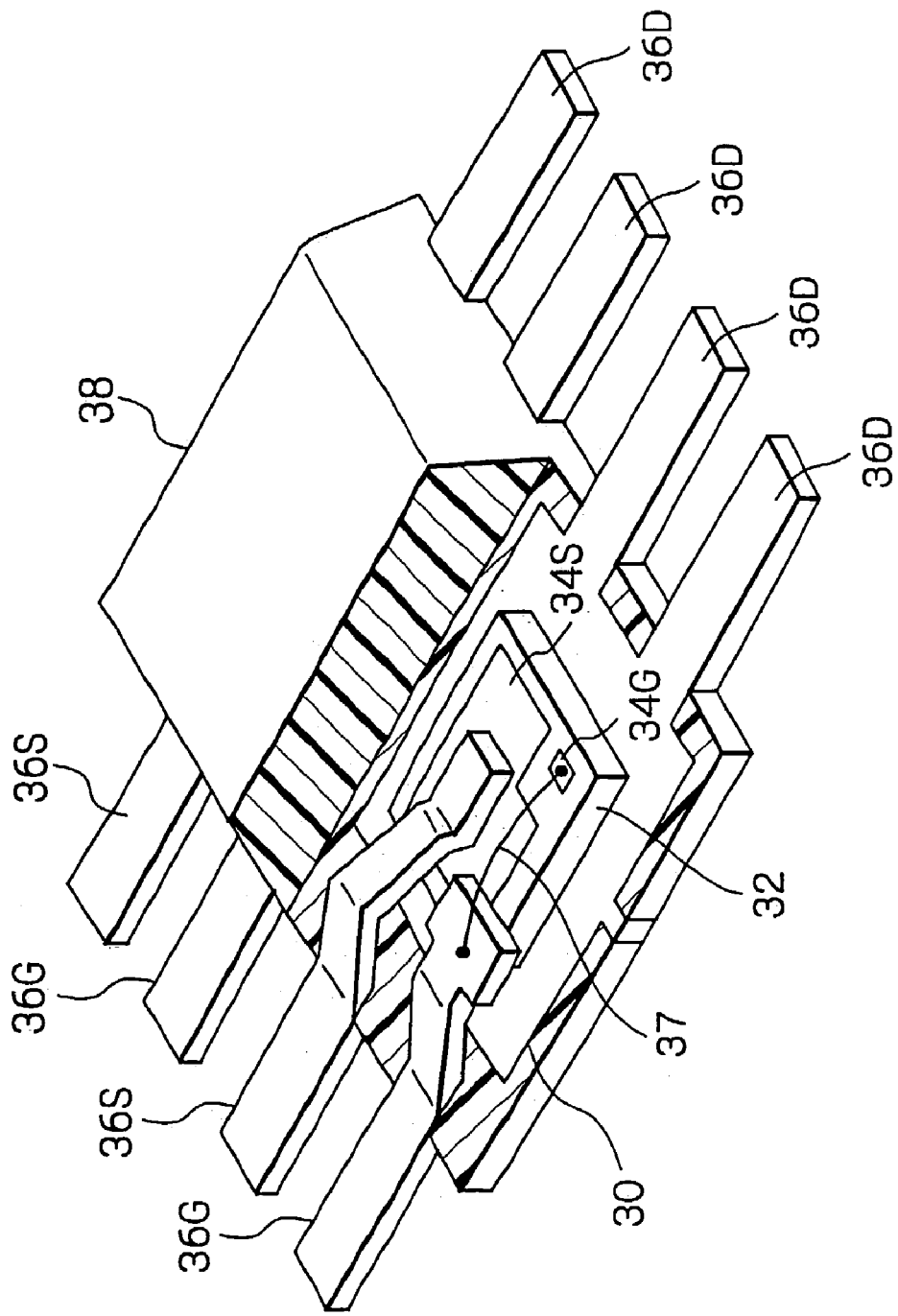
FIG. 4 is a partially-cutaway perspective view showing a first embodiment of a semiconductor package according to the present invention, which is constructed as a dual-in-line electronic package.
Figure 5:
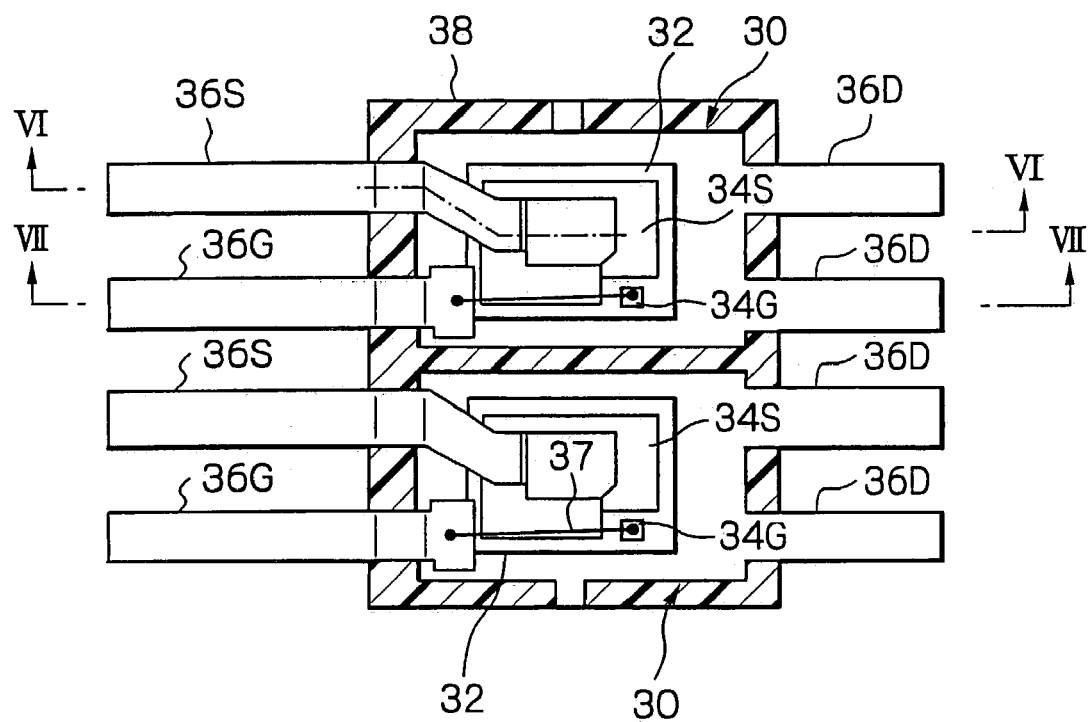
FIG. 5 is a partially-cutaway plan view of the dual-in-line electronic package according to the present invention.

As is apparent from FIGS. 4 and 5, this dual-in-line type electronic package includes two plate-like mounts 30, two semiconductor chips 32 mounted on the respective plate-like mounts 30. In this first embodiment, each of the semiconductor chips 32 is formed as a power MOSFET. Namely, each semiconductor chip 32 has a drain electrode 34D (FIGS. 5 and 6) formed on its bottom surface, and a source electrode 34S and a gate electrode 34G formed on its top surface. Note, as shown in FIGS. 4 and 5, the source electrode 34S has a considerably larger area than that of the gate electrode 34G.

Each of the plate-like mounts 30 has a pair of leads 36D integrally extended therefrom, and these leads 36D function as drain-electrode terminals. Also, the dual-in-line type electronic package is provided with two sets of leads 36S and 36G, and each set of leads 36S and 36G is associated with each semiconductor chip 32 so as to be electrically connected to the corresponding source and gate electrodes 34S and 34G.

Figure 6:
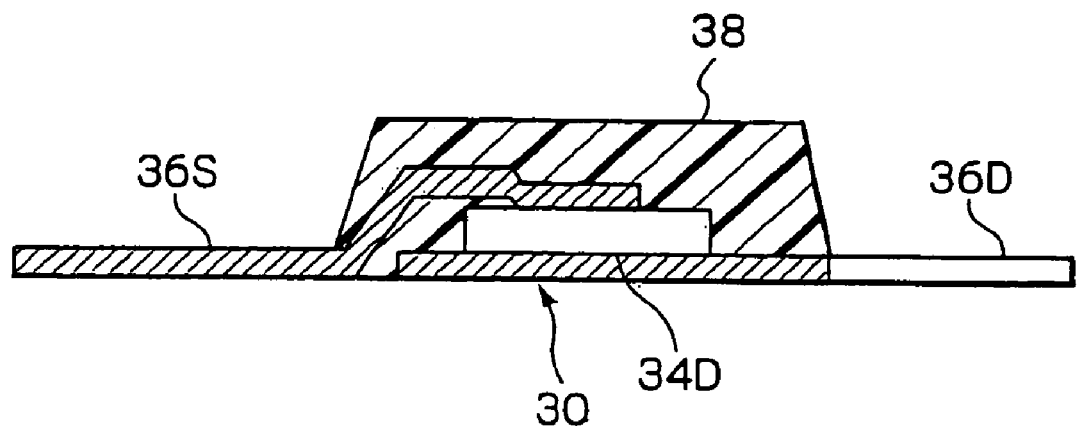
FIG. 6 is a cross-sectional view, taken along the VI—VI line of FIG. 5.

In particular, as best shown in FIG. 6, each lead 36S has an outer portion arranged to be flush with the plate-like mount 30, and an inner portion deformed and shaped to overhang the corresponding semiconductor chip 32 such that the inner end of the lead 36S is electrically connected to the corresponding source electrode 34S. For example, the electrical connection of the inner end of the lead 36S to the source electrode 34S is carried out, using a suitable electric conductive material, such as silver paste, solder paste or the like.

Figure 7:
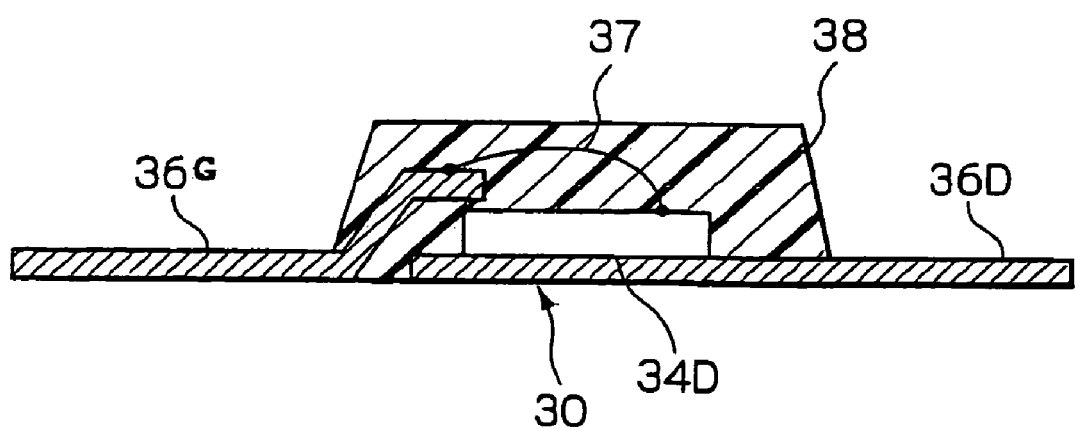
FIG. 7 is a cross-sectional view, taken along the VII—VII line of FIG. 5.

On the other hand, as best shown in FIG. 7, each lead 36G has an outer portion arranged to be flush with the plate-like mount 30, and an inner portion deformed and shaped to overhang the corresponding semiconductor chip 32 such that an inner end of the lead 36G is spaced apart from the top surface of the semiconductor chip 32. As shown in FIGS. 4, 5 and 7, each lead 36G is electrically connected at its inner end to the gate electrode 34G by a bonding-wire 37. Note, in this embodiment, a clearance between the top surface of the semiconductor chip 32 and the inner end of the lead 36G may be on the order of 70 μm.

Further, the dual-in-line type electronic package includes a molded resin or enveloper 38, by which the plate-like mounts 30, the semiconductor chips 32, and the inner portions of the leads 36D, 36S, and 36G are encapsulated and sealed.

In the above-mentioned first embodiment, it is possible to make the size of the enveloper 38, and therefore the dual-in-line type electronic package, small, because both the inner portions of the leads 36S and 36G in each set overhang the semiconductor chip 32. Also, since it is possible to make the area of the source electrode 34S considerably larger than that of the gate electrode 34G due to the electrical connection of the inner end of each lead 35G to the corresponding gate electrode 34G by the bonding-wire 37, a high power performance can be achieved in the dual-in-line type electronic package.

In short, it is possible to use a large-sized semiconductor chip (32) in the dual-in-line electronic package having leads as electrode terminals, without increasing a size of the dual-in-line electronic package.

Next, with reference to FIGS. 8 to 27, a process for manufacturing the above-mentioned dual-in-line electronic package will be explained below.

Figure 8:
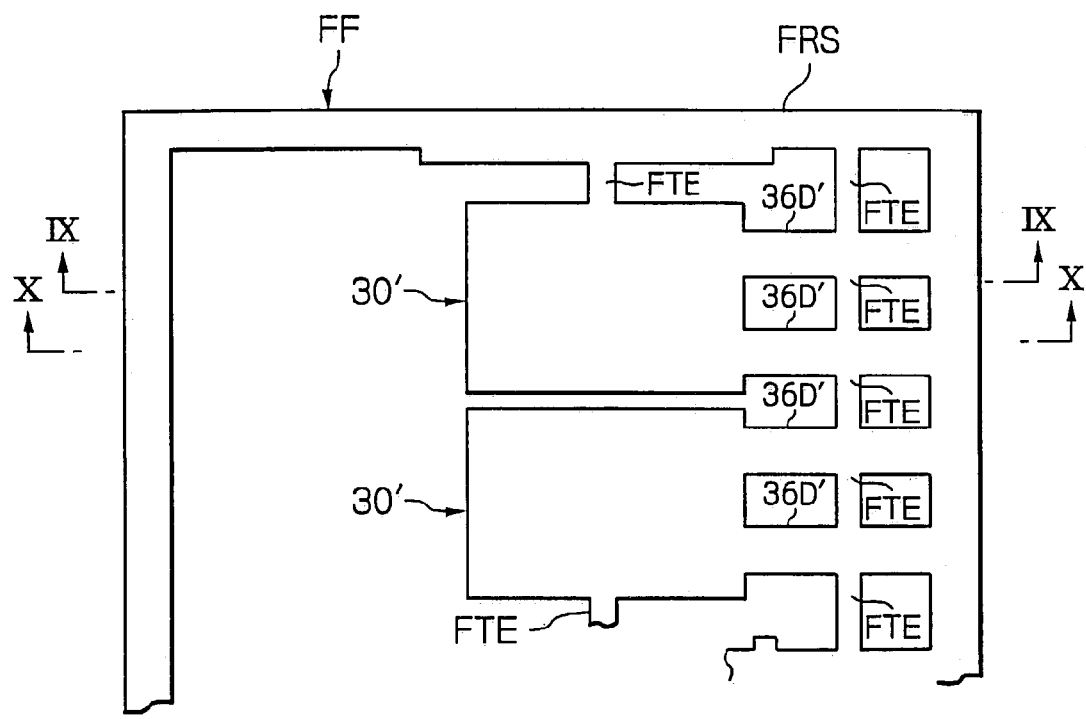
FIG. 8 is a partial plan view of a first lead frame, which is used in a production process for manufacturing the dual-in-line electronic package according to the present invention.
Figure 9:
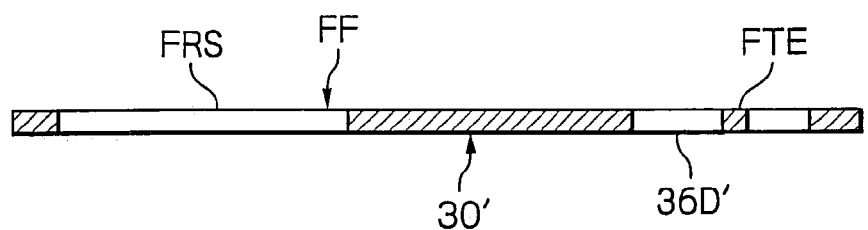
FIG. 9 is a cross-sectional view, taken along the IX—IX line of FIG. 8.
Figure 10:
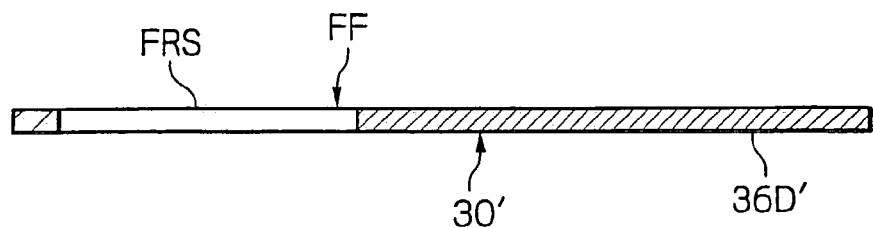
FIG. 10 is a cross-sectional view, taken along the X—X line of FIG. 8.

First, as shown in FIG. 8, a first lead frame FF is prepared, and is punched and produced from a suitable metal sheet by a well known punching machine. Note, the metal sheet may be made of copper, brass or the like.

The first lead frame FF includes a rectangular outer frame section FRS, plural sets of two plate-like mount sections 30', and a pair of lead sections 36D' extending from each plate-like mount section 30', and the plate-like mount sections 30' and lead sections 36D' are suitably supported by the outer frame section FRS through the intermediary of tie bar elements FTE. As is apparent from FIGS. 9 and 10, all the sections RS, 30', 36D', and FTE are flush with each other.

Note, in FIG. 8, only one set of two plate-like mount sections 36D' is representatively illustrated, and is used to manufacture a dual-in-line electronic package as shown in FIGS. 4 to 7. Namely, the plate-like mounts 30 shown in FIG. 5 result from the plate-like mount sections 30' shown in FIG. 8, and the two pairs of leads 36D shown in FIG. 5 result from the two pairs of lead sections 36' shown in FIG. 8.

Figure 11:
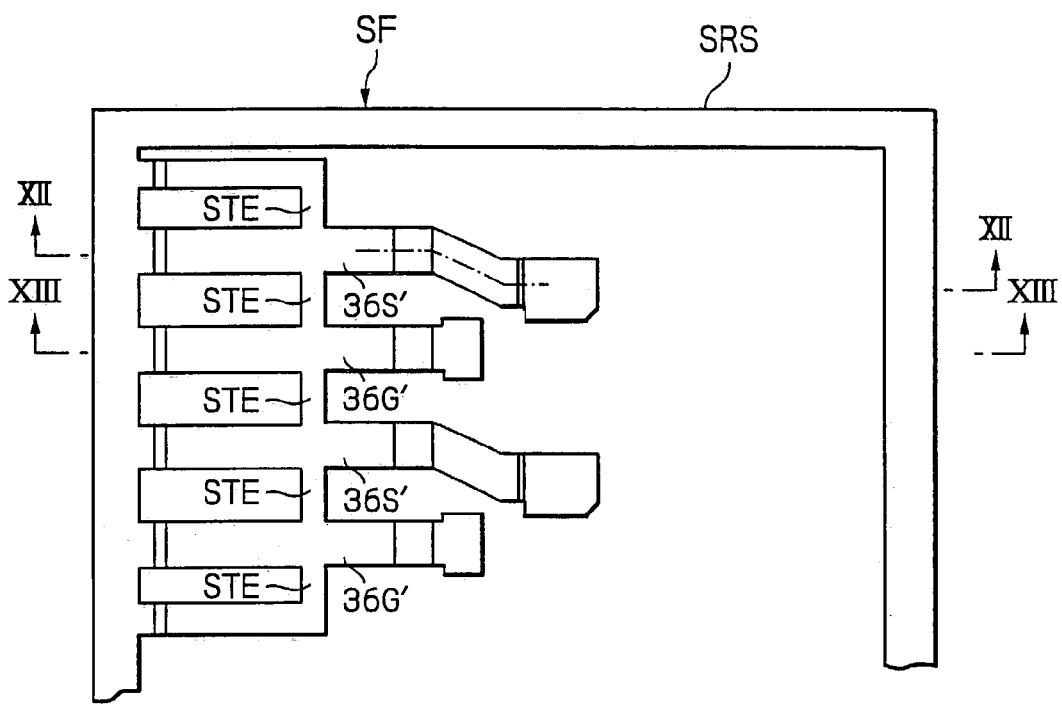
FIG. 11 is a partial plan view of a second lead frame, which is used in the production process for manufacturing the dual-in-line electronic package according to the present invention.

Also, as shown in FIG. 11, a second lead frame SF is prepared, and is punched and produced from a suitable metal sheet by a well known punching press machine. Note, preferably, the second lead frame SF is made of the same metal as the first lead frame FF. Also, note that the second lead frame SF has substantially the same size and thickness as the first lead frame FF.

The second lead frame SF includes a rectangular outer frame section SRS, and plural sets of two lead sections 36S' and 36G', and the lead sections 36S' and 36G' are suitably supported by the outer frame section SRS through the intermediary of tie bar elements STE. Note, in FIG. 11, only two sets of lead sections 36S' and 36G' are representatively illustrated.

Figure 12:
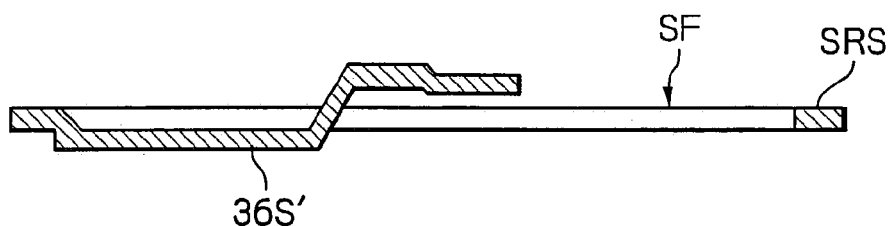
FIG. 12 is a cross-sectional view, taken along the XII—XII line of FIG. 11.
Figure 13:
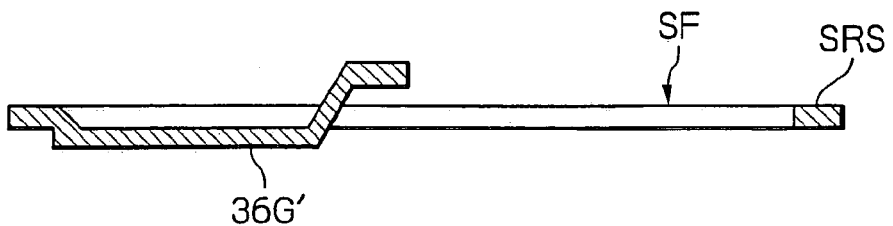
FIG. 13 is a cross-sectional view, taken along the XIII—XIII line of FIG. 11.
Figure 14:
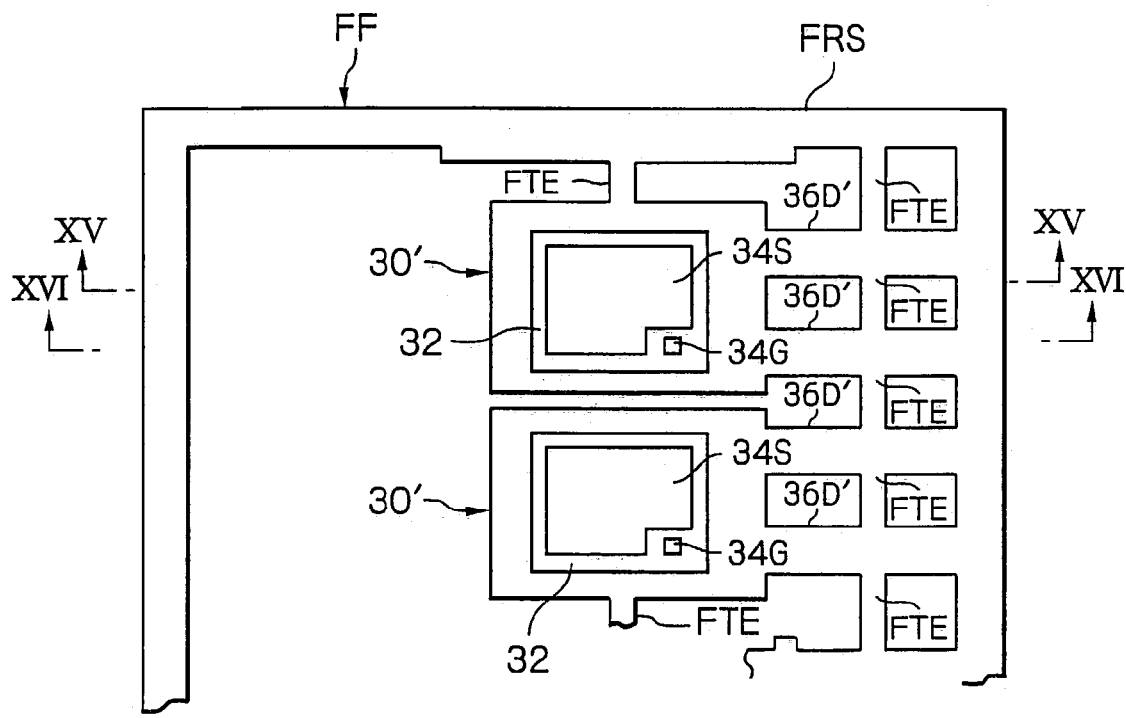
FIG. 14 is a partial plan view, similar to FIG. 8, in which respective semiconductor chips are mounted on plate-like mount sections of the first lead frame.
Figure 15:
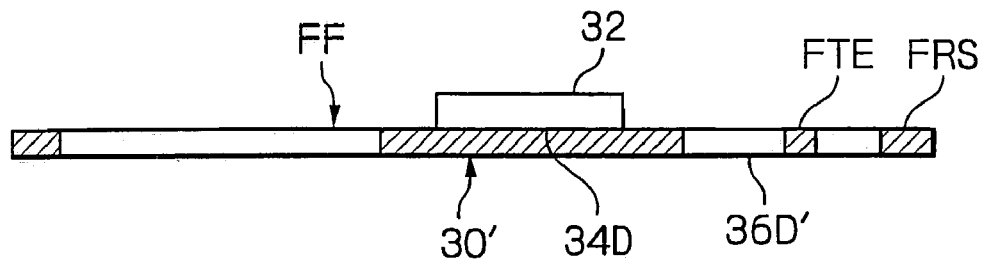
FIG. 15 is a cross-sectional view, taken along the XV—XV line of FIG. 14.
Figure 16:
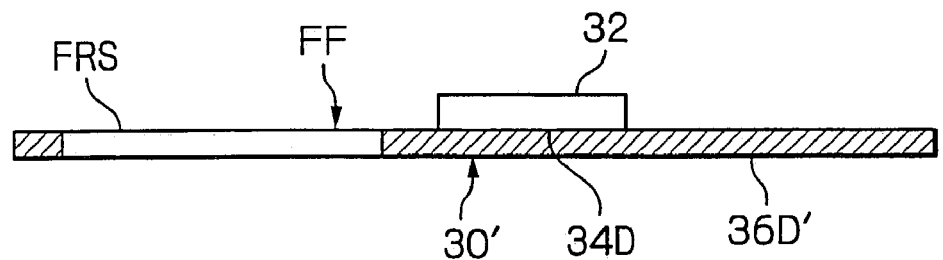
FIG. 16 is a cross-sectional view, taken along the XVI—XVI line of FIG. 14.

While the second lead frame SF is punched from the metal sheet by the punching press machine, the lead sections 36S' and 36G' are subjected to a press formation processing. In particular, by the press formation processing, the lead sections 36S' and 36G' are depressed so as to be offset from the rectangular outer frame section SRS by the thickness of the rectangular outer frame section SRS, and respective inner portions of the lead sections 36S' and 36G' are deformed and shaped as shown in FIGS. 12 and 13. Namely, the inner portions of the lead sections 36S' and 36G' have substantially the same shapes as shown in FIGS. 6 and 7. In short, the two sets of lead sections 36S and 36G shown in FIGS. 4 and 5 result from the two sets of lead sections 36S' and 36G' shown in FIG. 11.

Figure 17:
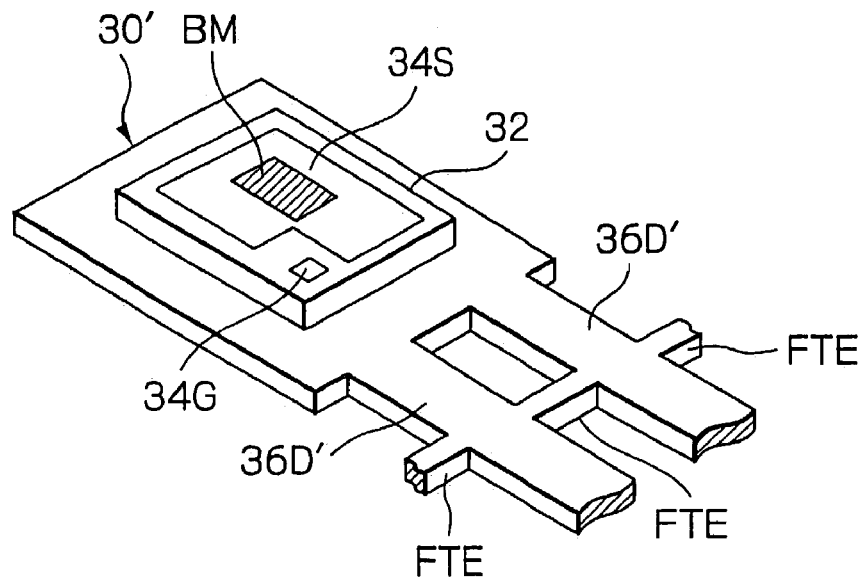
FIG. 17 is a partially enlarged perspective view showing one of plate-like mount sections included in the first lead frame.

After the preparation of the first and second lead frames FF and SF, either silver paste or electrically conductive adhesive is applied to each plate-like mount section 30' of the first lead frame FF. Then, a plurality of semiconductor chips 32 are prepared. As stated above, each semiconductor chip 32 has a drain electrode 34D formed on its bottom surface, and a source electrode 34S and a gate electrode 34G formed on its top surface. The respective semiconductor chips 32 are mounted on the plate-like mount sections 30' such that the drain electrode 34D of each semiconductor chip 32 is electrically connected to the corresponding mount section 30', as is apparent from FIGS. 14, 15, and 16. Subsequently, a suitable bonding material BM, such as solder paste, silver paste or the like, is applied to and printed on the source electrodes 34S, as shown in FIG. 17.

Figure 18:
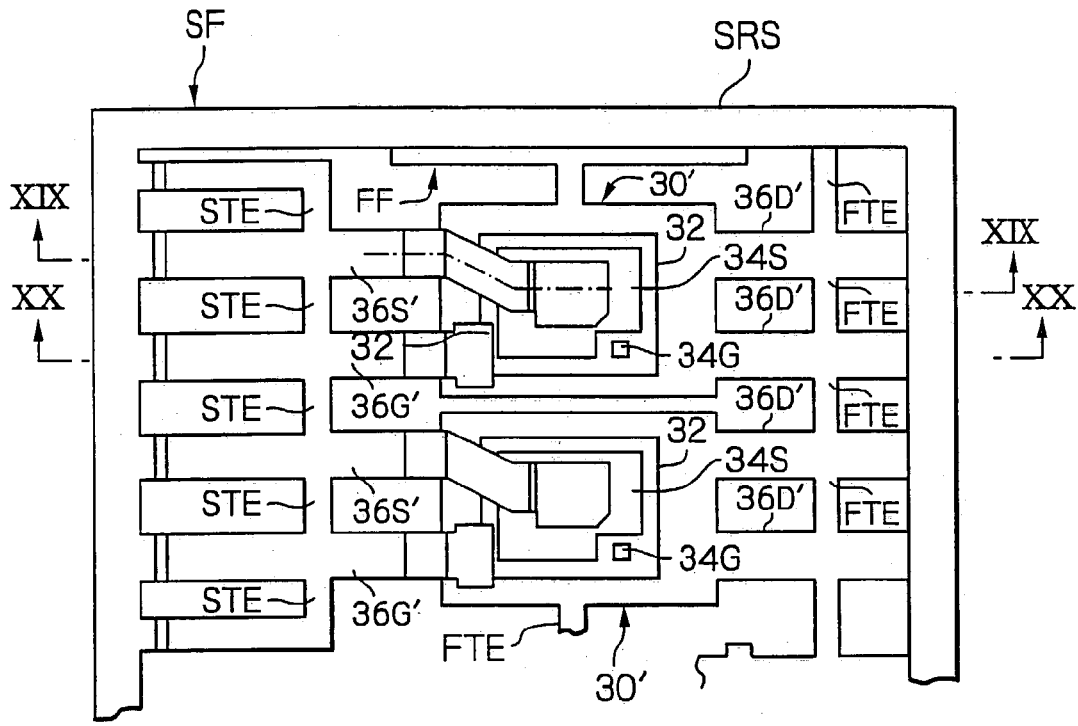
FIG. 18 is a partial plan view of the first and second lead frames combined and registered with each other, with the respective semiconductor chips being mounted on the plate-like mount section of the first lead frame.
Figure 19:
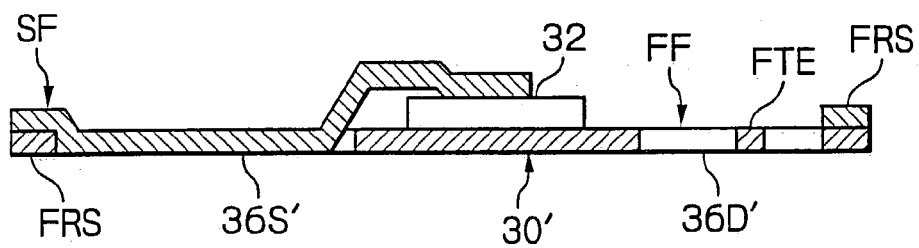
FIG. 19 is a cross-sectional view, taken along the XIX—XIX line of FIG. 18.
Figure 20:
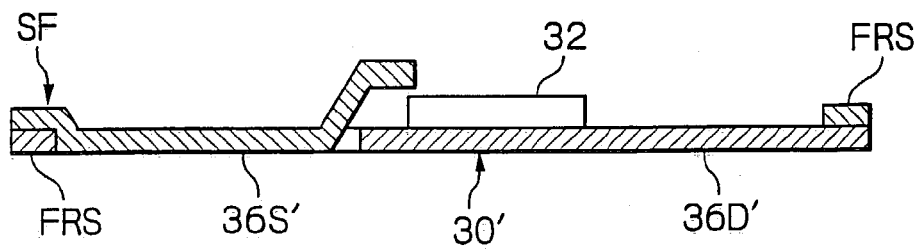
FIG. 20 is a cross-sectional view, taken along the XX—XX line of FIG. 18.

After the application of the bonding material MB to the source electrodes 34S, the second lead frame SF is combined and registered with the first lead frame FF, as shown in FIGS. 18, 19, and 20. Thus, as best shown in FIG. 19, an inner portion of each lead section 36S' overhangs a corresponding semiconductor chip 32, and an inner end of each lead section 36S' is contacted with the source electrode 34S of that semiconductor chip 32. Also, as best shown in FIG. 20, an inner portion of each lead section 36G' overhangs a corresponding semiconductor chip 32. Then, the combined first and second lead frames FF and SF are put in a suitable oven, and is heated such that the bonding material, such as solder paste, silver paste or the like, is thermally fused, whereby the inner end of each lead section 36S' can be securely bonded to the corresponding source electrode 34S.

Preferably, although not illustrated, suitable positioning marks are formed in the outer frame sections FRS and SRS of the first and second leads frames FF and SF to thereby facilitate the combination and registration of the first and second lead frames FF and SF. For example, the positioning marks may be two sets of a depression and a projection, which are arranged to be fitted with each other when the combination and registration of the first and second lead frames FF and SF are properly carried out.

Figure 21:
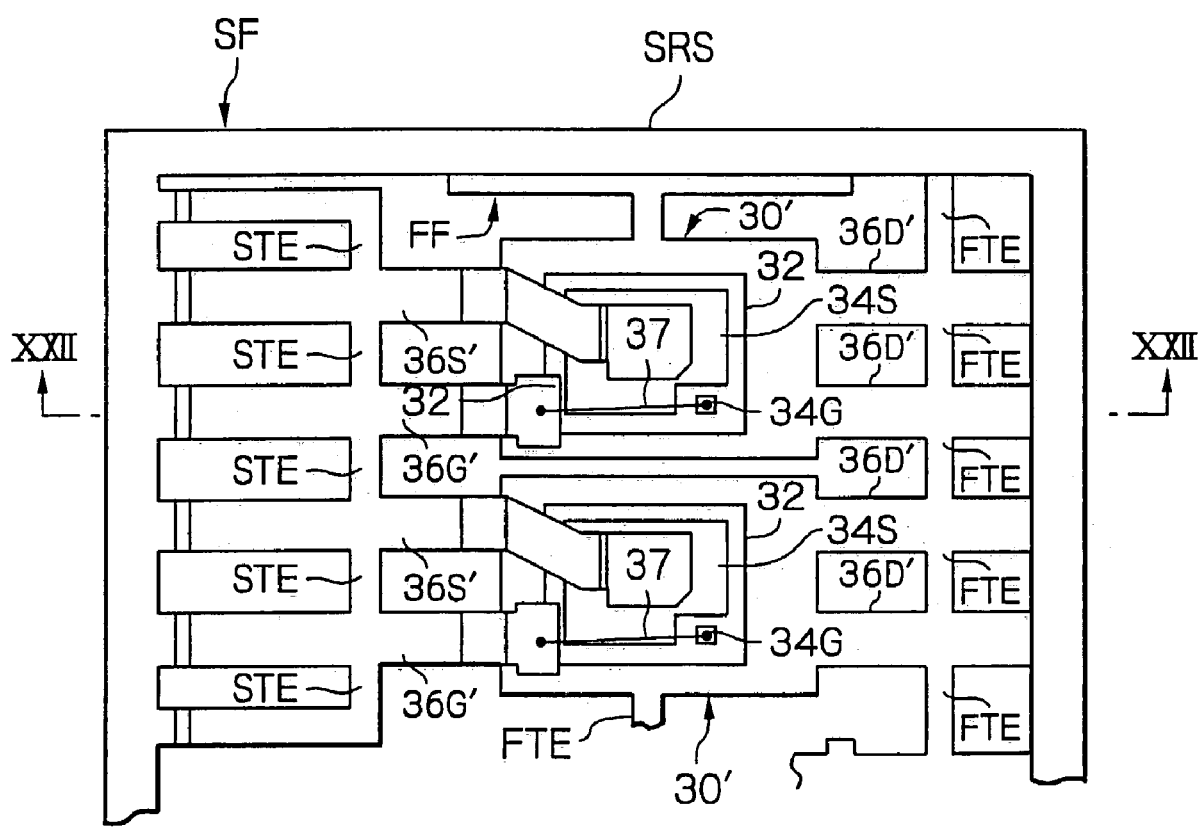
FIG. 21 is a partial plan view, similar to FIG. 18, in which a set of two lead sections, included in the second lead frame, are electrically connected to source and gate electrodes formed on the corresponding semiconductor chip.
Figure 22:
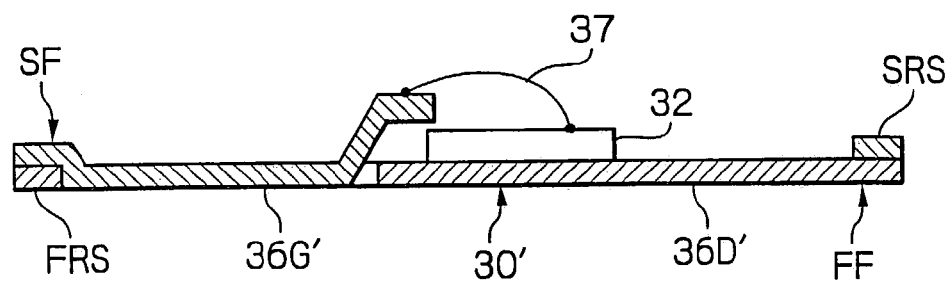
FIG. 22 is a cross-sectional view, taken along the XXII—XXII line of FIG. 20.
Figure 23:
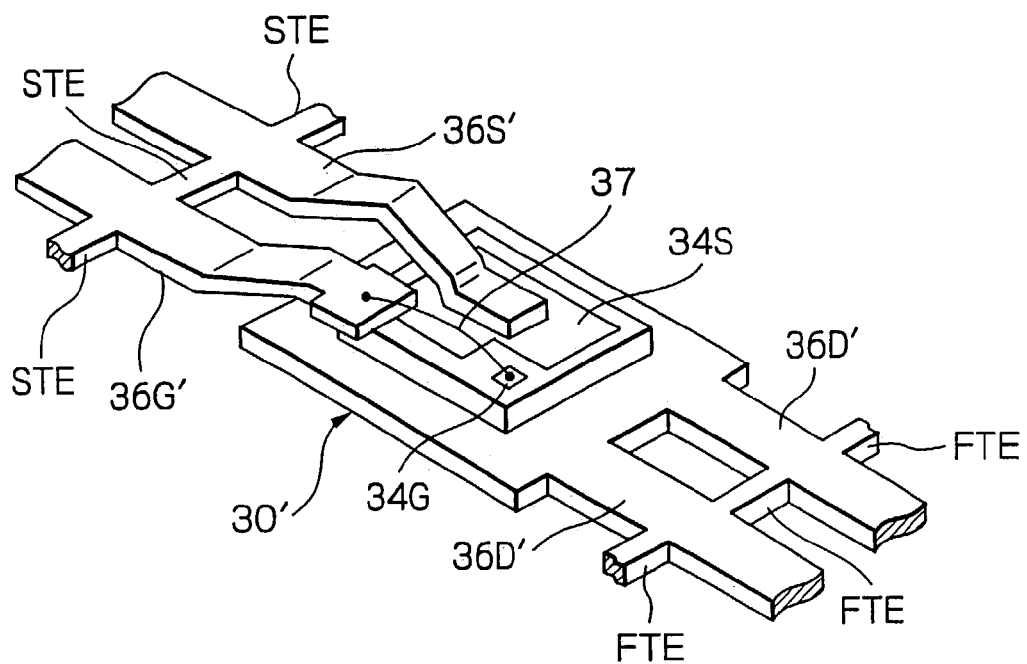
FIG. 23 is a partially-enlarged perspective view showing one of plate-like mount sections included in the first lead frame and a set of two lead sections included in the second lead frame and associated with the plate-like mount section.

After the bonding of the respective inner ends of the lead sections 36S' to the source electrodes 34S, the combined first and second lead frames FF and SF are set in a well known wire-bonding machine, and an inner end of each lead section 36G' of the second lead frame SF is electrically connected to a gate electrode 34G of a corresponding semiconductor chip 32 by a bonding-wire 37, as shown FIGS. 21, 22, and 23.

Thereafter, the combined first and second lead frames FF and SF are set in a molding machine including plural pairs of mold halves, such that each set of two plate-like mount sections 30', the semiconductor chips 32 mounted thereon, and the inner portions of the lead sections 36D', 36S', and 36G' associated therewith are sandwiched between the mold halves in each pair, and a suitable thermosetting resin material, such as epoxy or the like, is introduced into a molding cavity defined by the mold halves. Then, the mold halves in each pair are heated such that the introduced resin material is thermally set. After the thermal setting of the introduced resin material is completed, the combined first and second lead frames FF and SF are removed from the molding machine.

Figure 24:
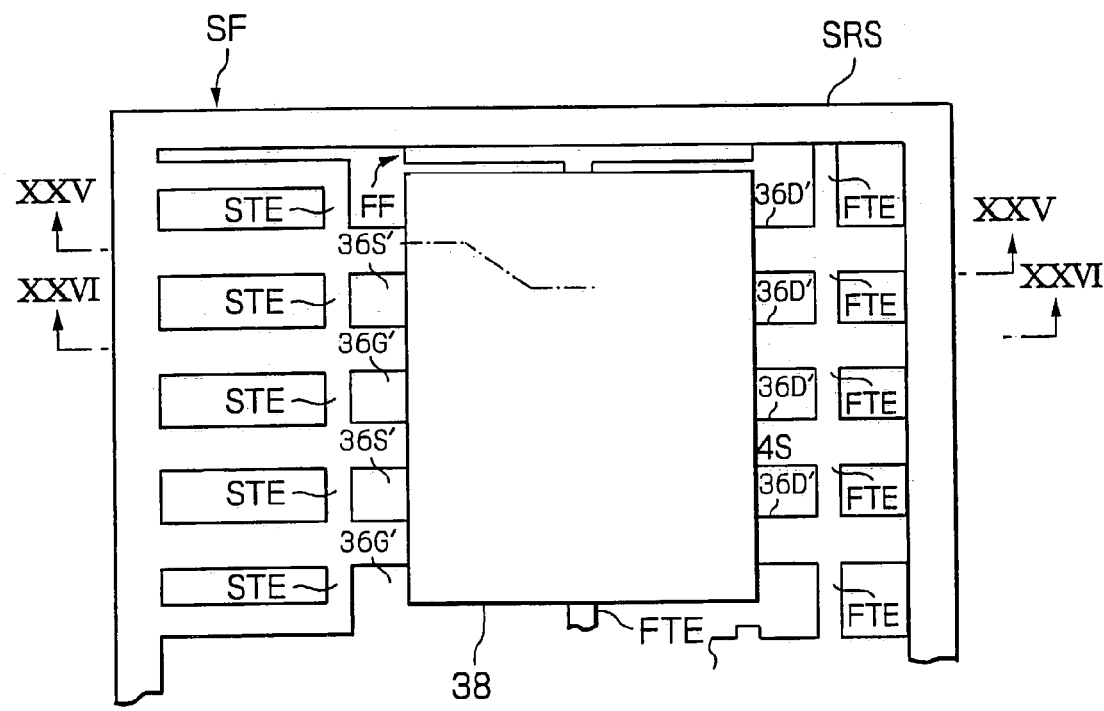
FIG. 24 is a partial plan view, similar to FIG. 20, in which the set of two plate-like mount sections, the semiconductor chips mounted thereon and so on are sealed by a molded resin or enveloper.
Figure 25:
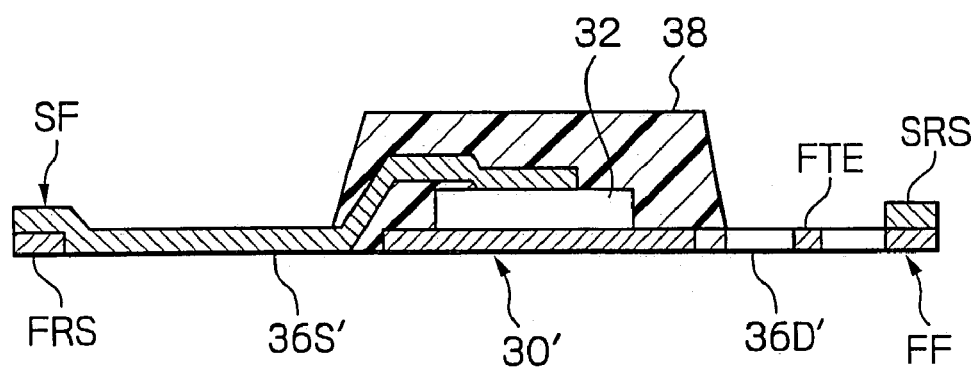
FIG. 25 is a cross-sectional view, taken along the XXV—XXV line of FIG. 24.
Figure 26:
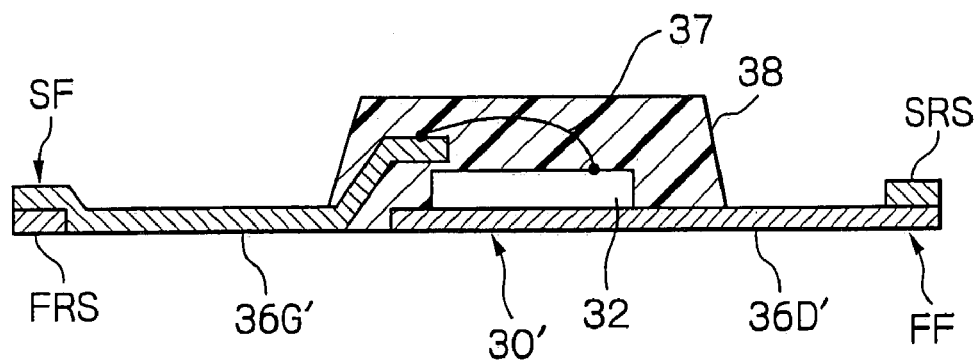
FIG. 26 is a cross-sectional view, taken along the XXVI—XXVI line of FIG. 24.

Thus, as shown in FIGS. 24, 25, and 26, each set of two plate-like mount sections 30', the semiconductor chips 32 mounted thereon, and the inner portions of the lead sections 36D', 36S', and 36G' are sealed and encapsulated in the mold resin or enveloper 38, resulting in production of the plurality of dual-in-line electronic packages on the combined first and second lead frames FF and SF.

Figure 27:
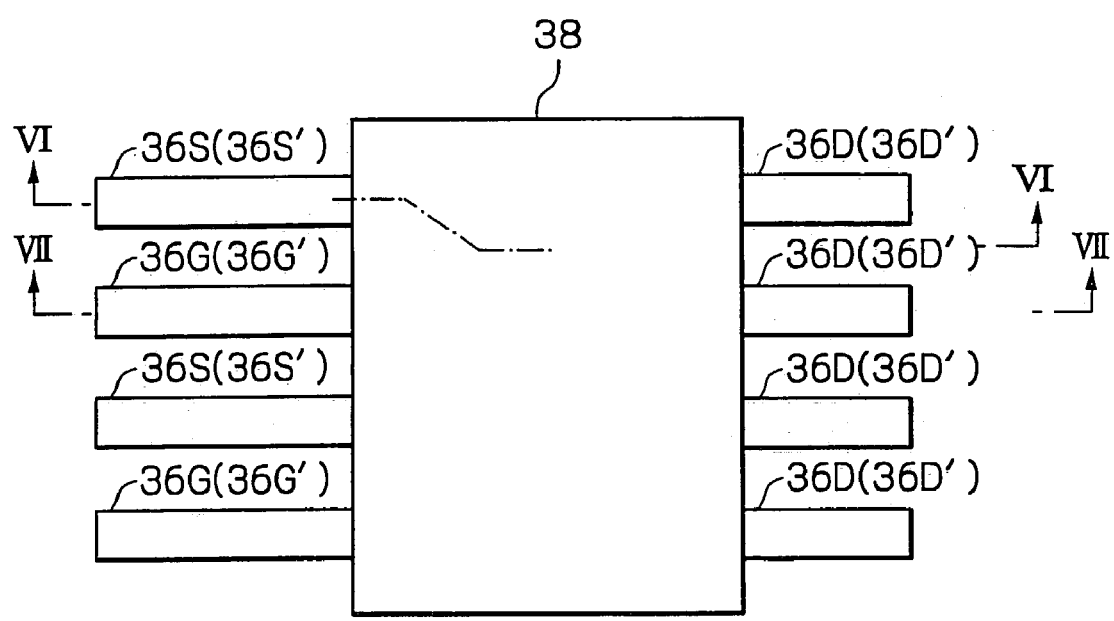
FIG. 27 is a plan view of the dual-in-line electronic package manufactured by the production process according to the present invention.

Thereafter, the dual-in-line electronic packages are individually cut and separated from both the lead frames FF and SF, using a suitable punching machine. With reference to FIG. 27, a separated dual-in-line electronic package is representatively illustrated. Note, respective two cross-sectional views, taken along the VI-VI and VII-VII lines of FIG. 27 are equivalent to FIGS. 6 and 7.

In the above-mentioned first embodiment, as is apparent from FIGS. 6 and 7, and FIGS. 25 and 26, each enveloper 38 is molded such that the bottom surface of the plate-like mount 30 (30') is exposed to the outside. This feature is very significant because each semiconductor chip 32 is formed as the power MOSFET, as stated above. In particular, although the power MOSFET generates a significant amount of heat during operation of the dual-in-line package, it is possible to efficiently radiate the heat from the exposed bottom surface of the plate-like mount 30 (30'). Namely, the plate-like mount 30 (30') serves as a heat-radiating plate. Of course, in a case where each semiconductor chip (MOSFET) 32 functions as a switching element, the bottom surface of the plate-like mount 30 (30') may be covered with a sealing resin.

With reference to FIGS. 28 to 31, a modification of the first embodiment of the semiconductor package according to the present invention is shown. Note, in these drawings, the features similar to those of the first embodiment are indicated by the same references.

Figure 28:
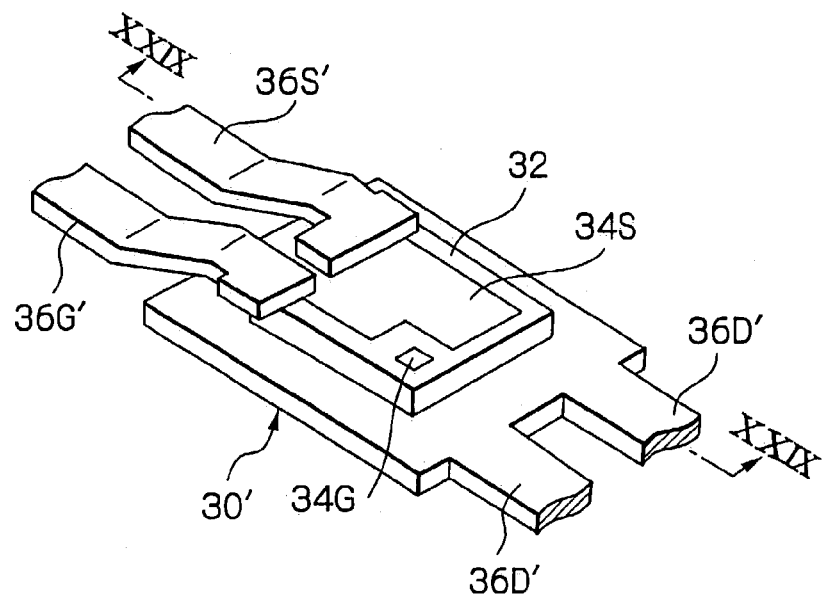
FIG. 28 is a partially-enlarged perspective view of a modification of the first embodiment of the present invention, showing one of plate-like mount sections included in a first lead frame and a set of two lead sections included in a second lead frame and associated with the plate-like mount section.
Figure 29:
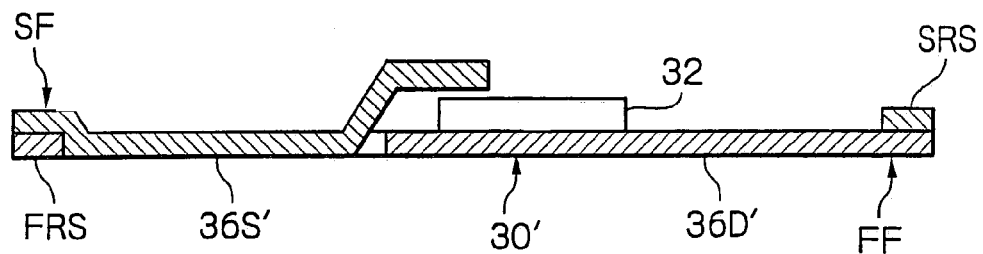
FIG. 29 is a cross-sectional view, taken along the XXIX—XXIX line of FIG. 28.

In this modified embodiment, a first lead frame FF has substantially the same arrangement as the first embodiment, but a second lead frame SF is somewhat different from that of the first embodiment in that an inner end of each lead section 36S' cannot be contacted with a source electrode 34S of a corresponding semiconductor chip 32, as shown in FIGS. 28 and 29. Namely, similar to a lead section 36G', an inner portion of each lead section 36S' is only deformed and shaped to overhang the semiconductor chip 32, and the inner end of the lead section 36S' is spaced apart from the top surface of the semiconductor chip 32.

Figure 30:
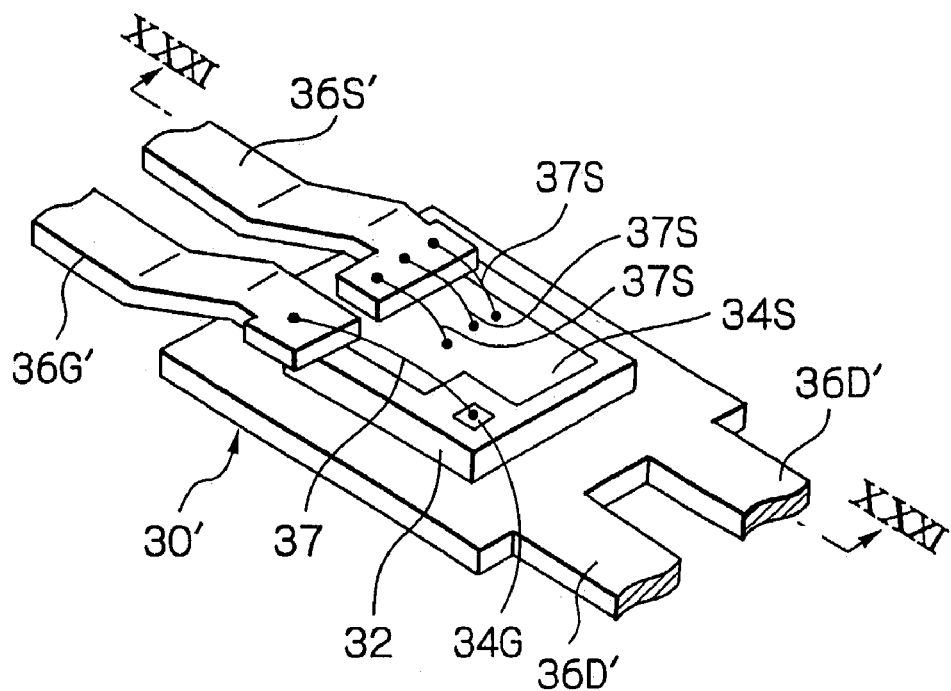
FIG. 30 is a partially-enlarged perspective view, similar to FIG. 30, in which the set of two lead sections are electrically connected by bonding-wires to source and gate electrodes of a semiconductor chip mounted on the plate-like mount section.
Figure 31:
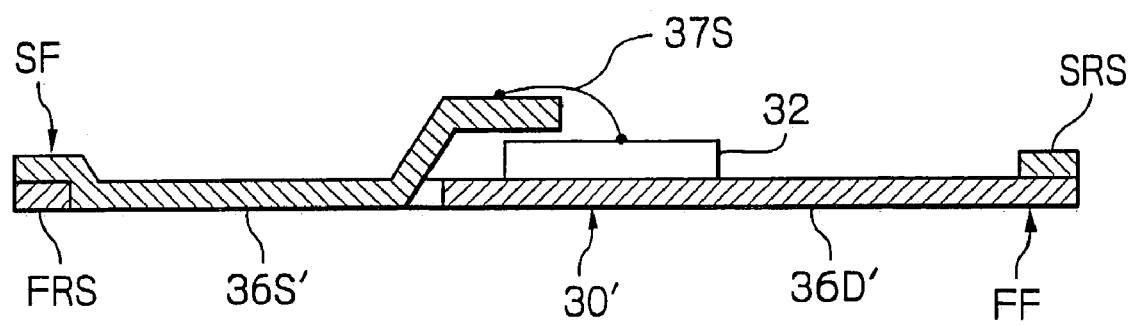
FIG. 31 is a cross-sectional view, taken along the XXXI—XXXI line of FIG. 30;.

Thus, as shown in FIGS. 30 and 31, the inner end of the lead section 36S' is electrically connected to the source electrode 34S of the semiconductor chip 32 by boundingwires 37S. Namely, in the modified embodiment, when an inner end of each lead section 36G' is bonded to a gate electrode of a corresponding semiconductor chip 32 by a bonding wire 37, using a well known wire-bonding machine, the bonding of the inner end of the lead section 36S' to the source electrode 34S by the bonding-wires 37S is carried out, using the same wire-bonding machine.

In short, in the modified embodiment, it is possible to omit a process for applying a bonding material (BM), such as solder paste, silver paste or the like, to the source electrodes 34S of the semiconductor chip 32, and a process for thermally fusing the bonding material (BM), which are necessary for the above-mentioned first embodiment.

Figure 32:
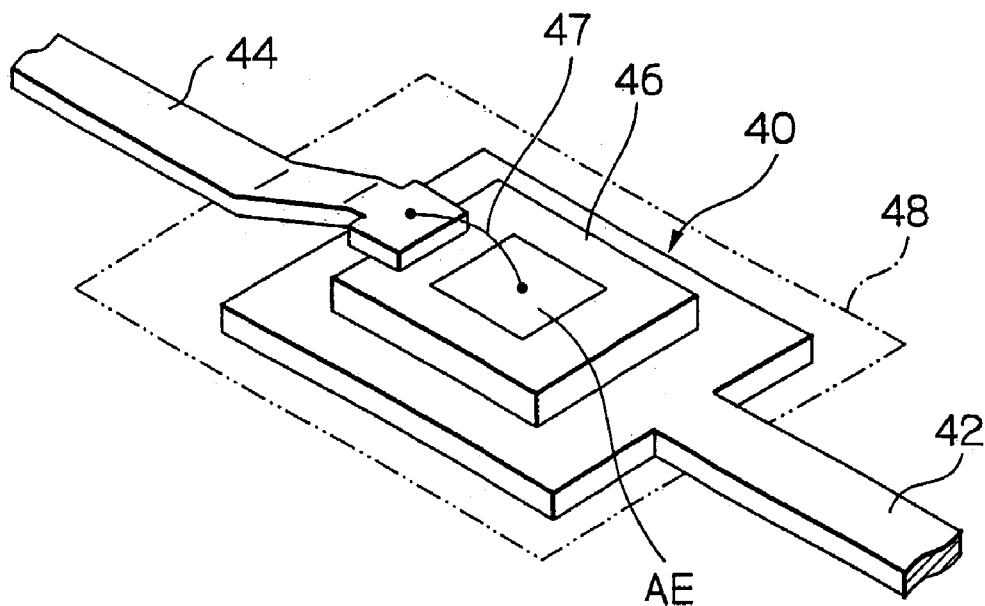
FIG. 32 is a schematic and partial perspective view showing a second embodiment of the semiconductor package according to the present invention, which is constructed as a high power diode package.

With reference to FIG. 32, a second embodiment of the semiconductor package according to the present invention is schematically illustrated in a partial perspective view. In the second embodiment, the semiconductor package is constructed as a high power diode package. Similar to the above-mentioned first embodiment, a first lead frame and a second lead frame are used to manufacture the high power diode package.

Although the first lead frame is not entirely illustrated in FIG. 32, it includes a plurality of plate-like mount sections 40, and a cathode lead section 42 integrally extending from each plate-like mount section 40, and these sections 40 and 42 are suitably supported by an outer frame section (not shown). Similarly, although the second lead frame is not entirely illustrated, it includes a plurality of anode lead sections 44 which are suitably supported by an outer frame section (not shown). Note, in FIG. 32, only one plate-like mount section 40 is representatively shown together the anode lead section 44 associated therewith.

In FIG. 32, reference 46 indicates a diode chip, which has a cathode electrode (not visible) formed on its bottom surface, and an anode electrode AE formed on its top surface. After either silver paste or electric conductive adhesive is applied to each plate-like mount section 40 of the first lead frame, a plurality of diode chips 46 are prepared. Then, each of the diode chips 46 is mounted on a corresponding plate-like mount section 40 such that an electrical connection is established between the plate-like mount section 40 and the cathode electrode 42 of the diode chip 46.

Thereafter, similar to the first embodiment, the second lead frame is combined and registered with the first lead frame, and thus an inner portion of each anode lead section 44 overhangs a corresponding diode chip 46 such that an inner end of the anode lead section 44 is spaced apart from the top surface of the diode chip 46. Then, the combined first and second lead frames are set in a well known wire-bonding machine, and an inner end of each anode lead section 42 is electrically connected to an anode electrode AE of a corresponding diode chip 46 by a bonding-wire 47, as just shown FIG. 32.

After the establishment of the electrical connection between the inner ends of the anode lead sections 42 and the anode electrodes AE of the diode chips 46 by the bonding-wires 47, the combined first and second lead frames are set in a molding machine including plural pairs of mold halves, such that each plate-like mount section 47, the semiconductor chip 46 mounted thereon, and the inner portions of the cathode and anode lead sections 42 and 44 associated therewith are sandwiched between the mold halves in each pair, and a suitable thermosetting resin material, such as epoxy or the like, is introduced into a molding cavity defined by the mold halves. Then, the mold halves in each pair are heated such that the introduced resin material is thermally set.

Thus, the plate-like mount section 40, the semiconductor chip 46, and the inner portions of the cathode and anode lead sections 42 and 44, encompassed by a rectangle 48 shown by a phantom line in FIG. 32, are sealed and encapsulated in the mold resin or enveloper, resulting in production of the plurality of high power diode packages on the combined first and second lead frames. Thereafter, the high power diode packages are individually cut and separated from both the lead frames, using a suitable punching machine.

Similar to the above-mentioned first embodiment, in the second embodiment, it is possible to use a large-sized diode chip in the diode package, without increasing a size of the diode package, because the inner portion of the anode lead is deformed and shaped to overhang the diode chip.

In the second embodiment, although the respective anode and cathode electrodes are formed on the top and bottom surfaces of the diode chip 46, these electrodes may be replaced with each other, if necessary.

Figure 33:
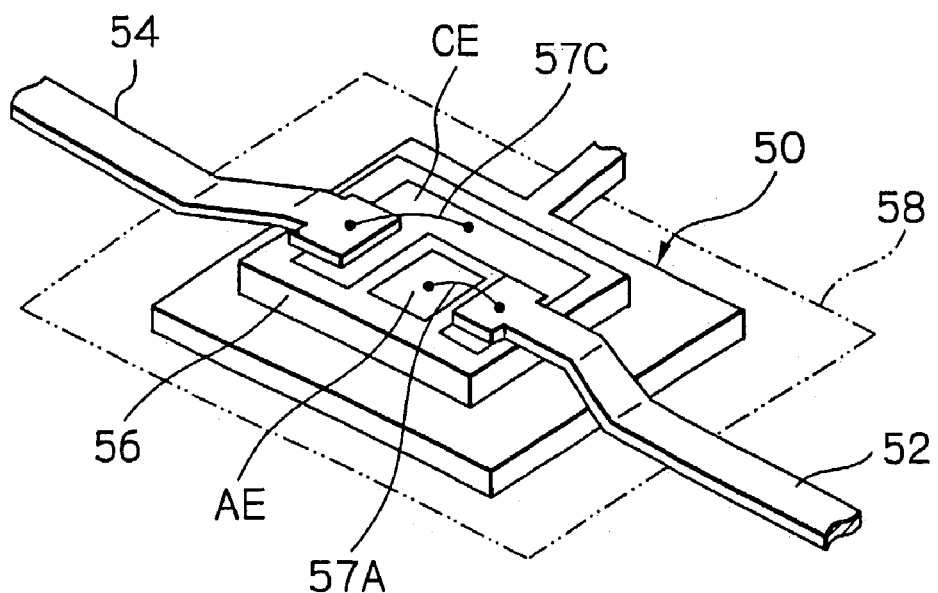
FIG. 33 is a schematic and partial perspective view showing a third embodiment of the semiconductor package according to the present invention, which is constructed as a high power diode package.

With reference to FIG. 33, a third embodiment of the semiconductor package according to the present invention is schematically illustrated in a partial perspective view. In the third embodiment, the semiconductor package is constructed as a low power diode package. Similar to the above-mentioned embodiments, a first lead frame and a second lead frame are used to manufacture the low power diode package.

Although the first lead frame is not entirely illustrated in FIG. 33, it includes a plurality of plate-like mount sections 50 which are suitably supported by an outer frame section (not shown). Similarly, although the second lead frame is not entirely illustrated, it includes plural sets of anode and cathode lead sections 52 and 54, and these sections 52 and 54 are suitably supported by an outer frame section (not shown). Note, in FIG. 33, only one plate-like mount section 50 is representatively shown together with the set of anode and cathode lead sections 52 and 54 associated therewith.

In FIG. 33, reference 56 indicates a diode chip, which has anode and cathode electrodes AE and CE formed on its top surface. After a suitable adhesive is applied to each plate-like mount section 50, a plurality of diode chips 56 are prepared, and each of the diode chips 56 is mounted on a corresponding plate-like mount section 50.

Thereafter, similar to the above-mentioned embodiments, the second lead frame is combined and registered with the first lead frame, and thus inner portions of anode and cathode lead sections 52 and 54 in each set overhang a corresponding diode chip 56 such that inner ends of the anode and cathode lead sections 52 and 54 are spaced apart from the top surface of the diode chip 56. Then, the combined first and second lead frames are set in a well known wire-bonding machine, and the respective inner ends of the anode and cathode lead sections 52 and 54 in each set are electrically connected to the anode and cathode electrodes AE and CE of the corresponding diode chip 56 by bonding-wires 57A and 57C, as just shown FIG. 33.

After the establishment of the electrical connection between the inner ends of the anode and cathode lead sections 52 and 54 and the anode and cathode electrodes AE and CE of the diode chips 46 by the bonding-wires 57A and 57C, the combined first and second lead frames are set in a molding machine including plural pairs of mold halves, such that each plate-like mount section 50, the semiconductor chip 46 mounted thereon, and the inner portions of the anode and cathode lead sections 52 and 54 associated therewith are sandwiched between the mold halves in each pair, and a suitable thermosetting resin material, such as epoxy or the like, is introduced into a molding cavity defined by the mold halves. Then, the mold halves in each pair are heated such that the introduced resin material is thermally set.

Thus, the plate-like mount section 50, the semiconductor chip 56, and the inner portions of the anode and cathode lead sections 52 and 54, encompassed by a rectangle 58 shown by a phantom line in FIG. 33, are sealed and encapsulated in the mold resin or enveloper, resulting in production of the plurality of low power diode packages on the combined first and second lead frames. Thereafter, the low power diode packages are individually cut and separated from both the lead frames, using a suitable punching machine.

Similar to the above-mentioned embodiments, in the third embodiment, it is possible to use a large-sized diode chip in the diode package, without increasing a size of the diode package, because the inner portions of the anode and cathode leads are deformed and shaped to overhang the diode chip.

Finally, it will be understood by those skilled in the art that the foregoing description is of preferred embodiments of the package, and that various changes and modifications may be made to the present invention without departing from the spirit and scope thereof.

The invention claimed is:

1. A semiconductor package comprising:
a planar mounting element;
a semiconductor chip having a bottom surface on which a first electrode is formed, and a top surface on which a second electrode and a third electrode are formed, said semiconductor chip being mounted on said planar mounting element such that the first electrode of said bottom surface is in electrical contact with said planar mounting element;
a first lead element having a first inner portion and a first outer portion, said first inner portion extending from said planar mounting element and electrically connected to said first electrode via said planar mounting element;
a second lead element having a second inner portion and a second outer portion, said second inner portion being bonded and electrically connected to said second electrode;
a third lead element having a third inner portion and a third outer portion, said third inner portion being positioned above and spaced apart from said top surface of said semiconductor chip;
a bonding wire element electrically connecting between said third inner portion and said third electrode; and
an enveloper encapsulating said planar mounting element, said semiconductor chip, said bonding wire element, and said first, second and third inner portions of said first, second and third lead elements.

2. The semiconductor package as set forth in claim 1, wherein said first, second and third outer portions of said first, second and third lead elements are projected outward from said enveloper.

3. The semiconductor package as set forth in claim 1, wherein said first, second and third outer portions of said first, second and third lead elements are substantially arranged so as to be coplanar with each other.

4. The semiconductor package as set forth in claim 1, wherein said second inner portion of said second lead element is bonded to said second electrode with electrically-conductive paste (BM).

5. The semiconductor package as set forth in claim 1, wherein said semiconductor chip comprises a MOSFET chip in which said respective first, second and third electrodes are formed as drain, source and gate electrodes.

6. The semiconductor package as set forth in claim 1, wherein said second electrode has a larger area than that of said third electrode.

7. The semiconductor package as set forth in claim 1, wherein said first outer portion of said first lead element is projected from a first side face of said enveloper, said second and third outer portions of said second and third lead elements are projected from a second side face opposed to said first side face of said enveloper.

8. The semiconductor package as set forth in claim 1, wherein one surface of said planar mounting element, which is opposed to another surface thereof on which said semiconductor chip is mounted, is exposed out of said enveloper.

9. The semiconductor package as set forth in claim 8, wherein the exposed surface of said planar mounting element is substantially coplanar with respect to said second and third outer portions of said second and third lead elements.

10. A semiconductor package comprising:
a plate-like mount;
a semiconductor chip having a first electrode formed on a bottom surface thereof, and a second electrode and a third electrode formed on a top surface thereof, said semiconductor chip being mounted on said plate-like mount such that said first electrode is in electrical contact with said planar mounting element;
a first lead element integrally extending from said plate-like mount and electrically connected to said first electrode via said plate-like mount;
a second lead element being bonded and electrically connected to said second electrode at an inner end thereof;
a third lead element having an inner end which is positioned above and spaced apart from said third electrode;
a bonding wire element electrically connecting between said third inner portion and said third electrode; and
a molded resin enveloper sealing and encapsulating said platelike mount, said semiconductor chip, and said bonding wire element so that respective outer end portions of said first, second and third lead elements extending out of said molded resin enveloper.

11. The semiconductor package as set forth in claim 10, wherein said outer portions of said first, second and third lead elements are substantially arranged so as to be coplanar with each other.

12. The semiconductor package as set forth in claim 10, wherein said inner end of said second lead element is bonded to said second electrode with electricallyconductive paste (BM).

13. The semiconductor package as set forth in claim 10, wherein said semiconductor chip comprises a MOSFET chip on which said respective first, second and third electrodes are formed as drain, source and gate electrodes.

14. The semiconductor package as set forth in claim 10, wherein said second electrode has a larger area than that of said third electrode.

15. The semiconductor package as set forth in claim 10, wherein said outer portion of said first lead element is projected from a first side face of said molded resin enveloper, said outer portions of said second and third lead elements are projected from a second side face opposed to said first side face of said molded resin enveloper.

16. The semiconductor package as set forth in claim 10, wherein one surface of said plate-like mount, which is opposed to another surface thereof on which said semiconductor chip is mounted, is exposed out of said molded resin enveloper.

17. The semiconductor package as set forth in claim 16, wherein the exposed surface of said plate-like mount is substantially coplanar with respect to said outer portions of said second and third lead elements.

* * * * *